(12) United States Patent
Hsieh et al.

(10) Patent No.: US 10,312,338 B2
(45) Date of Patent: *Jun. 4, 2019

(54) GATE STRUCTURE AND METHOD OF FABRICATING THE SAME

(71) Applicant: TAIWAN SEMICONDUCTOR MANUFACTURING COMPANY LIMITED, Hsin-Chu (TW)

(72) Inventors: Bo-Wen Hsieh, Miaoli County (TW); Yi-Chun Lo, Zhubei (TW); Wen-Jia Hsieh, Pusin Township (TW)

(73) Assignee: TAIWAN SEMICONDUCTOR MANUFACTURING COMPANY LIMITED, Hsin-chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/015,392

(22) Filed: Jun. 22, 2018

(65) Prior Publication Data

US 2018/0323270 A1 Nov. 8, 2018

Related U.S. Application Data

(63) Continuation of application No. 15/293,259, filed on Oct. 13, 2016, now Pat. No. 10,008,574.

(Continued)

(51) Int. Cl.
*H01L 29/423* (2006.01)
*H01L 21/28* (2006.01)
(Continued)

(52) U.S. Cl.
CPC .... *H01L 29/42376* (2013.01); *H01L 21/0276* (2013.01); *H01L 21/28088* (2013.01);
(Continued)

(58) Field of Classification Search
CPC .......... H01L 29/42376; H01L 29/4966; H01L 29/66492; H01L 29/66545; H01L 29/6659;
(Continued)

(56) References Cited

U.S. PATENT DOCUMENTS

2013/0299918 A1   11/2013  Kim et al.
2015/0021694 A1*  1/2015   Trevino ............ H01L 21/82382
                                                                257/368

(Continued)

FOREIGN PATENT DOCUMENTS

KR    10 2013 0126313 A   11/2013
KR    10 2015 0077543 A    7/2015

*Primary Examiner* — Tong-Ho Kim
(74) *Attorney, Agent, or Firm* — Cooper Legal Group, LLC

(57) ABSTRACT

A gate structure includes at least one spacer defining a gate region over a semiconductor substrate, a gate dielectric layer disposed on the gate region over the semiconductor substrate, a first work function metal layer disposed over the gate dielectric layer and lining a bottom surface of an inner sidewall of the spacer, and a filling metal partially wrapped by the first work function metal layer. The filling metal includes a first portion and a second portion, wherein the first portion is between the second portion and the semiconductor substrate, and the second portion is wider than the first portion.

20 Claims, 12 Drawing Sheets

Related U.S. Application Data

(60) Provisional application No. 62/261,201, filed on Nov. 30, 2015.

(51) Int. Cl.
  *H01L 29/66* (2006.01)
  *H01L 21/3213* (2006.01)
  *H01L 21/027* (2006.01)
  *H01L 29/49* (2006.01)
  *H01L 29/51* (2006.01)

(52) U.S. Cl.
  CPC .. *H01L 21/32134* (2013.01); *H01L 21/32139* (2013.01); *H01L 29/4966* (2013.01); *H01L 29/6659* (2013.01); *H01L 29/66492* (2013.01); *H01L 29/66545* (2013.01); *H01L 29/66636* (2013.01); *H01L 29/513* (2013.01); *H01L 29/517* (2013.01)

(58) Field of Classification Search
  CPC ............. H01L 29/66636; H01L 29/513; H01L 29/517; H01L 1121/0276; H01L 29/28088; H01L 29/32134; H01L 29/32139
  USPC ......................................................... 257/407
  See application file for complete search history.

(56) References Cited

U.S. PATENT DOCUMENTS

| | | |
|---|---|---|
| 2015/0187946 A1 | 7/2015 | Park et al. |
| 2015/0206963 A1* | 7/2015 | Ho ................... H01L 21/31111 257/411 |
| 2015/0228646 A1 | 8/2015 | Ho et al. |
| 2016/0042954 A1* | 2/2016 | Sung ................ H01L 21/32139 257/407 |
| 2017/0033105 A1* | 2/2017 | Wang ................ H01L 27/0924 |

* cited by examiner

GATE STRUCTURE AND METHOD OF FABRICATING THE SAME

PRIORITY CLAIM AND CROSS-REFERENCE

This application is a continuation of and claims priority to U.S. Non-Provisional application Ser. No. 15/293,259, titled "GATE STRUCTURE AND METHOD OF FABRICATING THE SAME" and filed on Oct. 13, 2016, which claims priority of U.S. Provisional Application Ser. No. 62/261,201, titled "APPROACH OF MG PULL BACK FOR MG MISSING" and filed on Nov. 30, 2015. U.S. Non-Provisional application Ser. No. 15/293,259 and U.S. Provisional Application Ser. No. 62/261,201 are incorporated herein by reference in their entirety.

BACKGROUND

As technology nodes shrink, in some integrated circuit designs, replacing the polysilicon gate electrode with a metal gate electrode can improve device performance with the decreased feature sizes. Providing metal gate structures (e.g., including a metal gate electrode rather than polysilicon) offers one solution. One process of forming a metal gate stack is termed a "gate last" process in which the final gate stack is fabricated "last" which allows for a reduced number of subsequent processes, including high temperature processing, that are performed before formation of the gate stack. Additionally, as the dimensions of transistors decrease, the thickness of the gate oxide may be reduced to maintain performance with the decreased gate length. In order to reduce gate leakage, high dielectric constant (high-k or HK) gate insulator layers are also used which allows to maintain the same effective thickness as would be provided by a typical gate oxide used in larger technology nodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
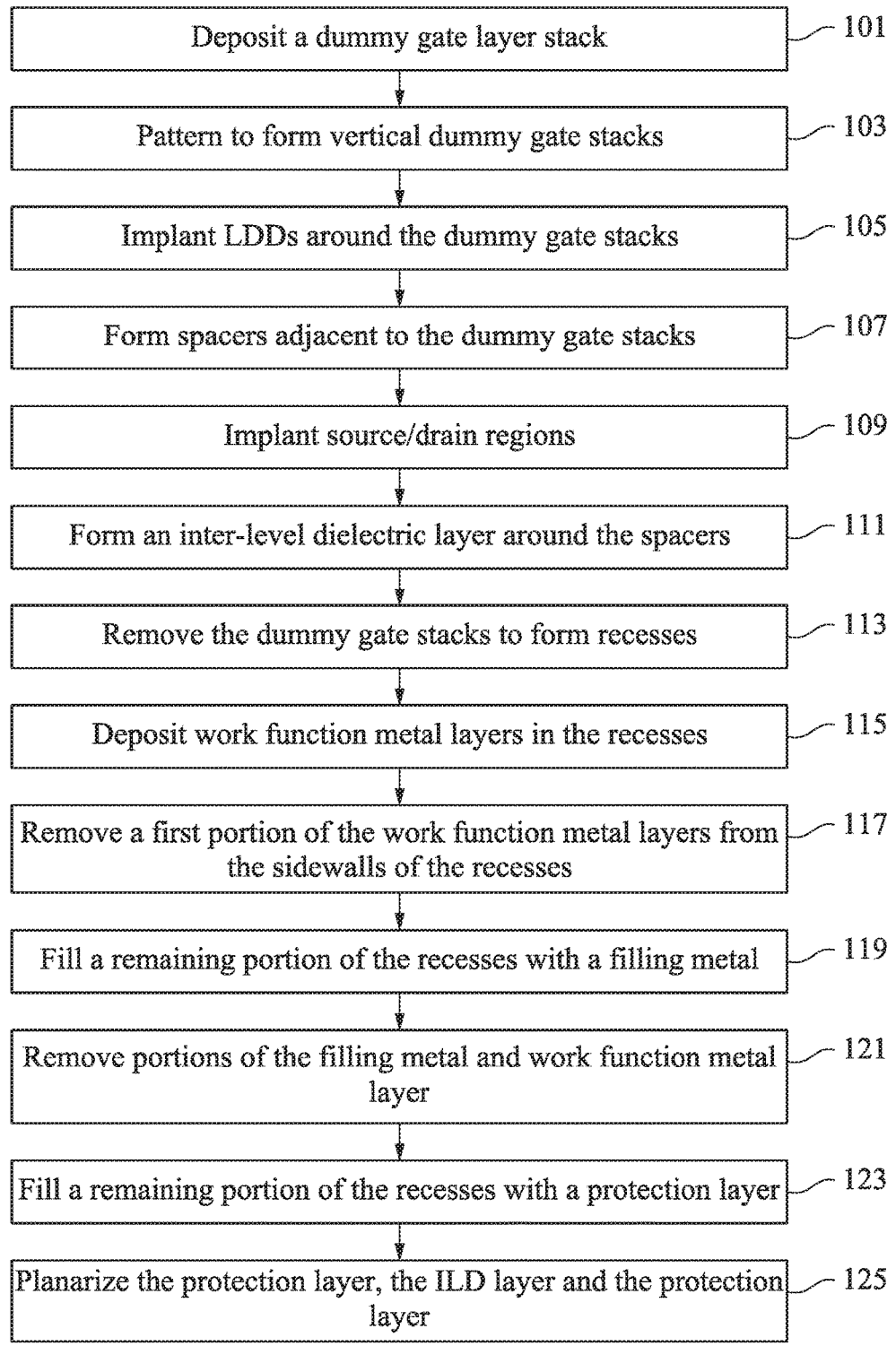
FIG. 1 is a flowchart of a method of fabricating a gate structure in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 100 of fabricating a gate structure in accordance with some exemplary embodiments of the instant disclosure. The method begins with operation 101 in which a dummy gate layer stack is formed on a semiconductor substrate of a wafer. The method continues with operation 103 in which vertical dummy gate stacks are formed by patterning the dummy gate layer stack. Subsequently, operation 105, lightly-doped drain and source (LDD) regions are formed in the semiconductor substrate. The method continues with operation 107 in which spacers are formed adjacent to the dummy gate stack. The method continues with operation 109 in which source and drain regions are formed in the semiconductor substrate. The method continues with operation 111 in which an inter-level dielectric (ILD) layer around the spacers. Next, operation 113, the dummy gate stacks are removed to form recesses. The method continues with operation 115 in which work function metal layers are deposited in the recesses. Following that, operation 117, a first portion of the work function metal layers from the sidewalls of the recesses is removed. In operation 119, a remaining portion of the recesses is filled with a filling metal. The method continues with operation 121 in which portions of the filling metal and work function metal layer is removed. Next, in operation 123, a remaining portion of the recesses is filled with a protection layer. In operation 125, the protection layer, the spacers, and the ILD layer are planarized.

FIGS. 2 to 19 are cross-sectional views of a method for manufacturing a semiconductor device at various stages in accordance with some embodiments of the present disclosure. In FIGS. 2-19, the wafer 300 is a semiconductor device at an intermediate stage of manufacture. The wafer 300 includes a semiconductor substrate 301. Examples of semiconductors include silicon, silicon on insulator (SOI), Ge, SiC, GaAs, GaAlAs, InP, and GaNSiGe. The semiconductor substrate 301 may be doped of either n-type or p-type, or undoped. Metal oxide semiconductor field effect transistors (MOSFETs) are added to the wafer 300. These can be of the n-type, the p-type or both types in a complementary metal oxide semiconductor (CMOS) process. In some embodiments, the wafer 300 includes n-well regions, p-well regions, or both. The method shown in FIGS. 1-19 is applicable to form planar MOSFETs and/or fin field effect transistors (FinFETs). When the method shown in FIGS. 2-19 is applied to form FinFETs, the semiconductor substrate 301 includes at least one fin structure. The portion of the semiconductor substrate 301 shown in FIGS. 2-19 is a portion of the fin structure.

Figure 2:
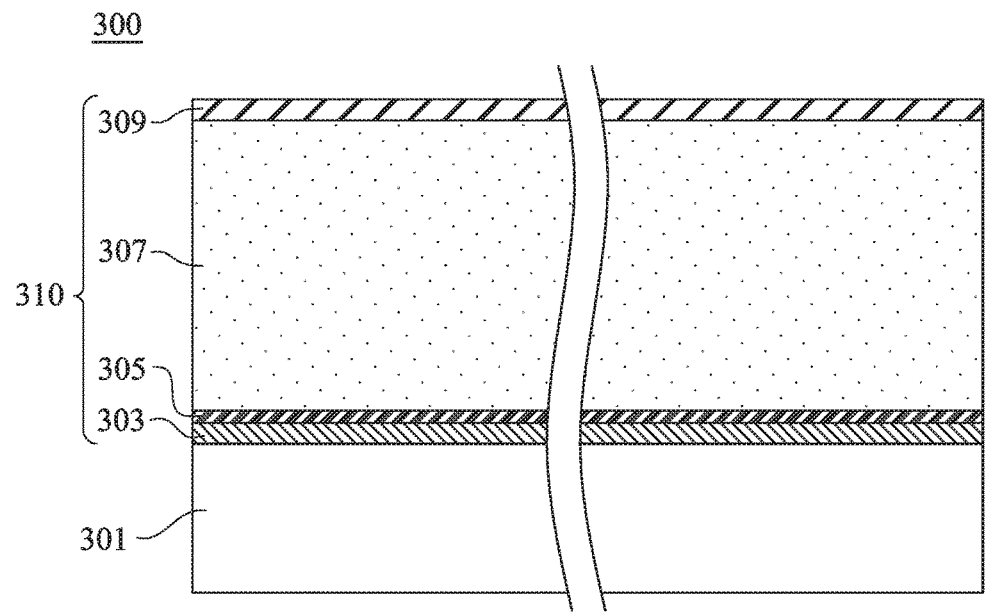
FIGS. 2 to 19 are cross-sectional views of a method for manufacturing a semiconductor device at various stages in accordance with some embodiments of the present disclosure.

Reference is made to FIG. 2. An interfacial layer 303 and a high-k dielectric layer (gate dielectric) 305 are formed over the semiconductor substrate 301 (operation 101 of FIG. 1). The interfacial layer 303 is the interface between the semiconductor substrate 301 and the high-k dielectric layer (gate dielectric) 305. The interfacial layer 303 includes silicon oxide or silicon oxynitride. The interfacial layer 303 can form spontaneously as a result of wet cleans of the wafer 300 prior to the formation of the high-k dielectric layer 305 or as a result of interaction between the high-k dielectric layer 305 and the semiconductor substrate 301 during or subsequent to formation of the dielectric layer 305. Intentionally forming the interfacial layer 303 can provide a higher quality interface. The interfacial layer 303 is made very thin to minimize the interfacial layer's contribution to the overall equivalent oxide thickness of the resulting gates. In some embodiments, the thickness of the interfacial layer 303 is in a range from about 1 to about 20 Angstroms.

The interfacial layer 303 of silicon oxide can be formed by a suitable process including chemical oxidation, for example, by treating the semiconductor substrate 301 with hydrofluoric acid (HF) immediately prior to depositing the high-k dielectric layer 305. Another process for the silicon oxide interfacial layer 303 is to thermally grow the interfacial layer 303 followed by a controlled etch to provide the desired layer thickness. In some embodiments, the interfacial layer 303 can be formed after the high-k dielectric layer 305. For example, a silicon oxynitride interfacial layer can be formed by annealing a wafer with a silicon semiconductor substrate and a hafnium-based high-k dielectric layer in an atmosphere of nitric oxide. This later process has advantages such as reduced queue time.

The high-k dielectric layer 305 includes one or more layers of one or more high-k dielectric materials. High-k dielectrics are expected to have a dielectric constant, k, of at least or equal to about 4.0. Examples of high-k dielectrics include hafnium-based materials such as $HfO_2$, HfSiO, HfSiON, HfTaO, HfTiO, HfZrO, and $HfO_2Al_2O_3$ alloy. Additional examples of high-k dielectrics include $ZrO_2$, $Ta_2O_5$, $Al_2O_3$, $Y_2O_3$, $La_2O_3$, and $SrTiO_3$. In some embodiments, the high-k dielectric layer 305 has a thickness in a range from about 5 to about 50 Angstroms. The high-k dielectric layer 305 can be formed by, for example, chemical vapor deposition (CVD) or atomic layer deposition (ALD).

Optionally, a capping layer may be formed over the high-k dielectric layer 305. The capping layer can protect the high-k dielectric layer 305 during subsequent processing and provide an etch stop layer for when the dummy gate material layer 307 is later removed. The capping layer can include one or more layers of materials, which may include, for example, TiN and TaN. The capping layer can be formed by a deposition process, such as CVD, ALD, or electroplating to a specified thickness.

Still referring to FIG. 2, a dummy gate material layer 307 is formed over the high-k dielectric layer 305. The dummy gate material layer 307 is made of polysilicon, although other materials can be used. The dummy gate material layer 307 can be formed by a semiconductor deposition process. For example, a polysilicon dummy gate material layer can be formed by pyrolyzing silane. After formation of the dummy gate material layer 307, a dummy gate layer stack 310 is formed on the wafer 300 as shown in FIG. 1. The dummy gate layer stack 310 includes the interfacial layer 303, the high-k dielectric layer 305 and the dummy gate material layer 307.

Figure 3:
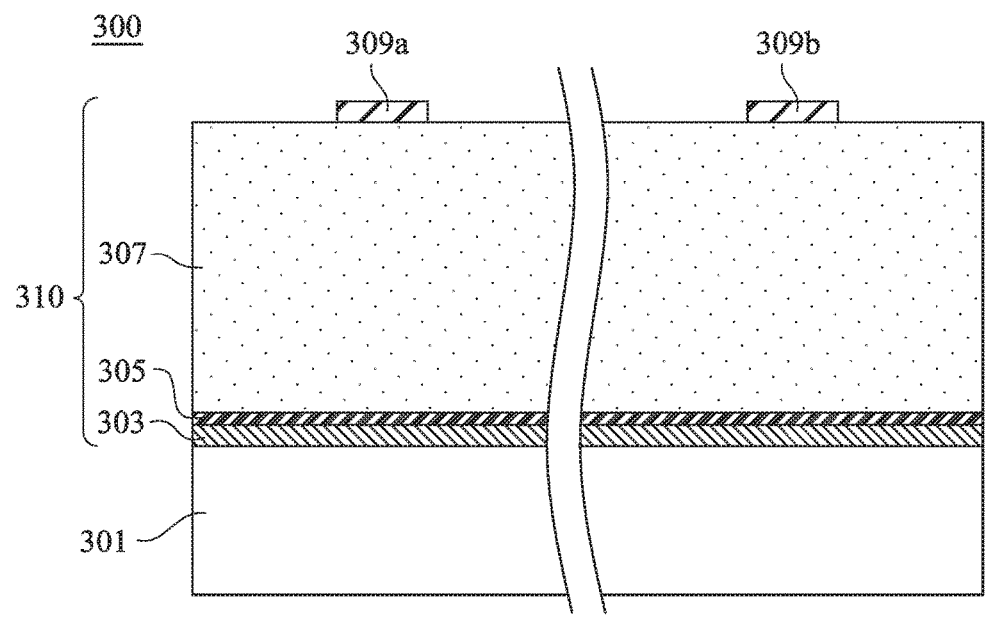
Figure 4:
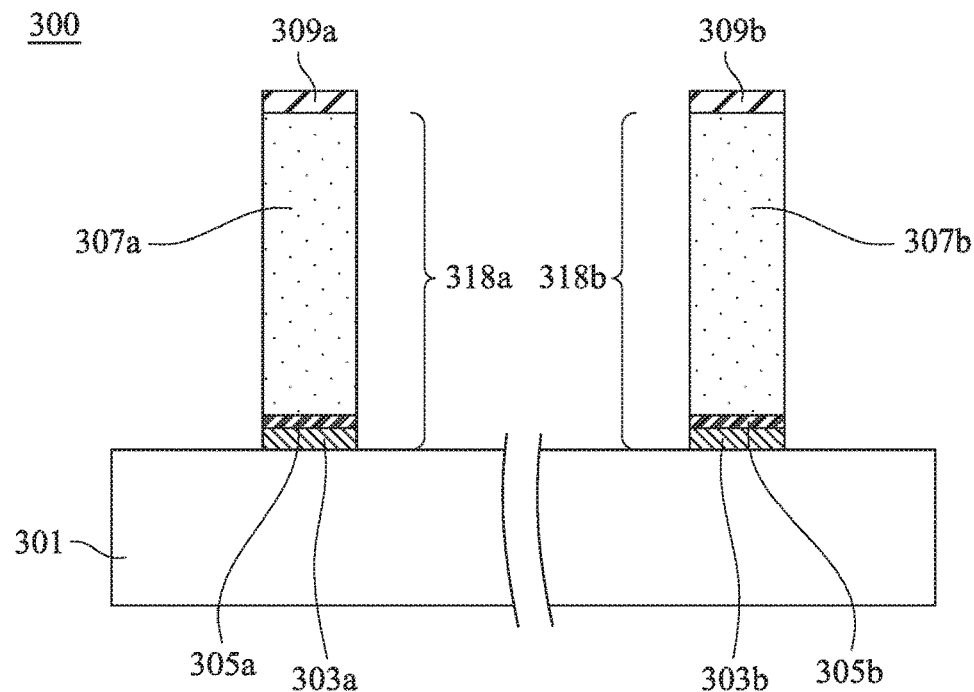

Reference is made to FIGS. 3-4. The dummy gate layer stack 310 is patterned to form dummy gate stacks 318a and 318b (operation 103 of FIG. 1). For forming the dummy gate stacks 318a and 318b, the patterning can be accomplished by a photolithographic process. The photolithography process includes coating the wafer 300 with a photoresist, selectively exposing the photoresist according to a desired pattern, developing the photoresist, and using the patterned photoresist as an etch mask. The patterned photoresist can be used as a mask to etch the dummy gate layer stack 310. Alternatively, the photoresist is used to pattern a hard mask layer. The hard mask layer, if used, is formed before the photoresist. The wafer 300 of FIG. 1 includes a hard mask layer 309 before patterning. The wafer 300 of FIG. 2 includes the patterned hard mask layers 309a and 309b. The patterned hard mask layers 309a and 309b are used as masks to etch the dummy gate layer stack 310. Any etch process or combination of etch processes can be used to etch the dummy gate layer stack 310.

Reference is made to FIG. 4. After patterning the dummy gate layer stack 310, the dummy gate stacks 318a and 318b are formed. The dummy gate 318a includes the interfacial layer 303a, the high-k dielectric layer 305a, the dummy gate material layer 307a, and the patterned hard mask layer 309a. Likewise, the dummy gate 318b includes the interfacial layer 303b, the high-k dielectric layer 305b, the dummy gate material layer 307b, and the patterned hard mask layer 309b. It should be understood that the dummy gate stacks 318a and 318b may not be adjacent to each other. For the sake of clarity and simplicity, the two dummy gate stacks 318a and 318b are put together for illustration purpose. The dummy gate stacks 318a and 318b may be separated apart by other features not shown in the figure.

A process for etching the dummy gate layer stack 310 includes a plasma etch. Reactive gases can interact with the wafer 300 during plasma etching to produce volatile by products that subsequently redeposit on nearby surfaces. This can result in the formation of an optional passivation layer (not shown) on sidewalls of the dummy gate stacks 318a and 318b respectively. The optional passivation layers can be silica or a similar material such as a silicate.

Figure 5:
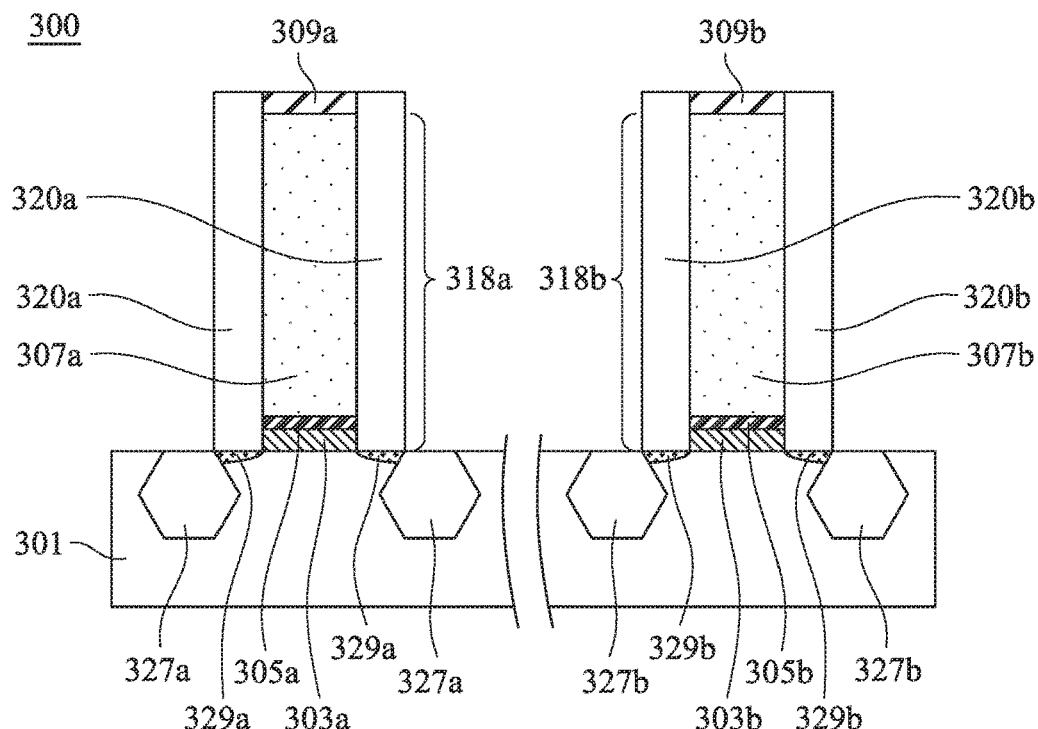

An ion implantation process is performed to form lightly doped drain (LDD) regions (operation 105 of FIG. 1). The dummy gate stacks 318a and 318b are used as masks to help control the implant profile and distribution. FIG. 5 shows the wafer 300 with the LDD regions 329a and 329b formed in the semiconductor substrate 301. After the ion implantation process, spacers 320a and 320b are formed around the dummy gate stacks 318a and 318b (operation 107 of FIG. 1). A spacer material is first deposited over the wafer 300 covering the dummy gate stacks 318a and 318b and the areas between the dummy gate stacks 318a and 318b. The spacer material is then etched back to remove the portions over the dummy gate stacks 318a and 318b and in the areas between the dummy gate stacks 318a, 318b. By tuning the etch process, selected portions 320a and 320b of the spacer material around the dummy gate stacks 318a and 318b remain after the etch back.

Before forming the spacers, optional spacer liners (not shown) may be formed. The spacer liners may be silica or silicate. The material of the spacer liners can be similar to the material of the passivation layers if both layers are present. The spacers 320a and 320b may be made of silicon nitride or another material that has the properties of conformal deposition, a large etch selectivity against the dummy gate material (harder to etch than the dummy gate material) and a passive material that can trap implanted dopants.

Still referring to FIG. 5, source/drain regions 327a and 327b are formed after the spacers 320a and 320b are formed (operation 109 of FIG. 1). The source/drain regions 327a and 327b are formed in the semiconductor substrate 301. In the embodiments where the dummy gate stack 318a and/or the dummy gate 318b is used to form a p-channel metal oxide semiconductor field effect transistor (pMOS) device, the source/drain regions 327a and/or the source/drain regions 327b are of p-type. In the embodiments where the dummy gate stack 318a and/or the dummy gate 318b is used to form an n-channel metal oxide semiconductor field effect transistor (nMOS) device, the source/drain regions 327a and/or the source/drain regions 327b are of n-type. The formation of source/drain regions 327a and 327b may be achieved by etching the semiconductor substrate 301 to form recesses therein, and then performing an epitaxy to grow the source/drain regions 327a and 327b in the recesses.

Figure 6:
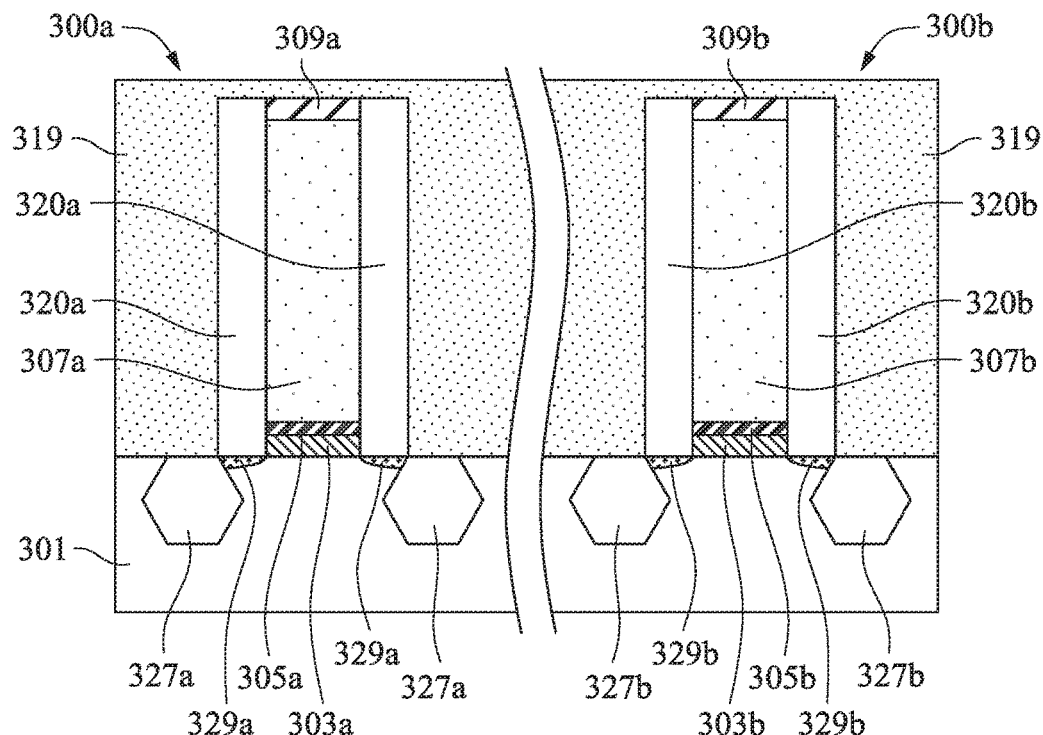

An inter-level dielectric (ILD) layer 319 is formed, as illustrated in FIG. 6 (operation 111 of FIG. 1). The ILD layer 319 adheres well to the spacers 320a and 320b and over the top of the hard mask layers 309a and 309b.

Figure 7:
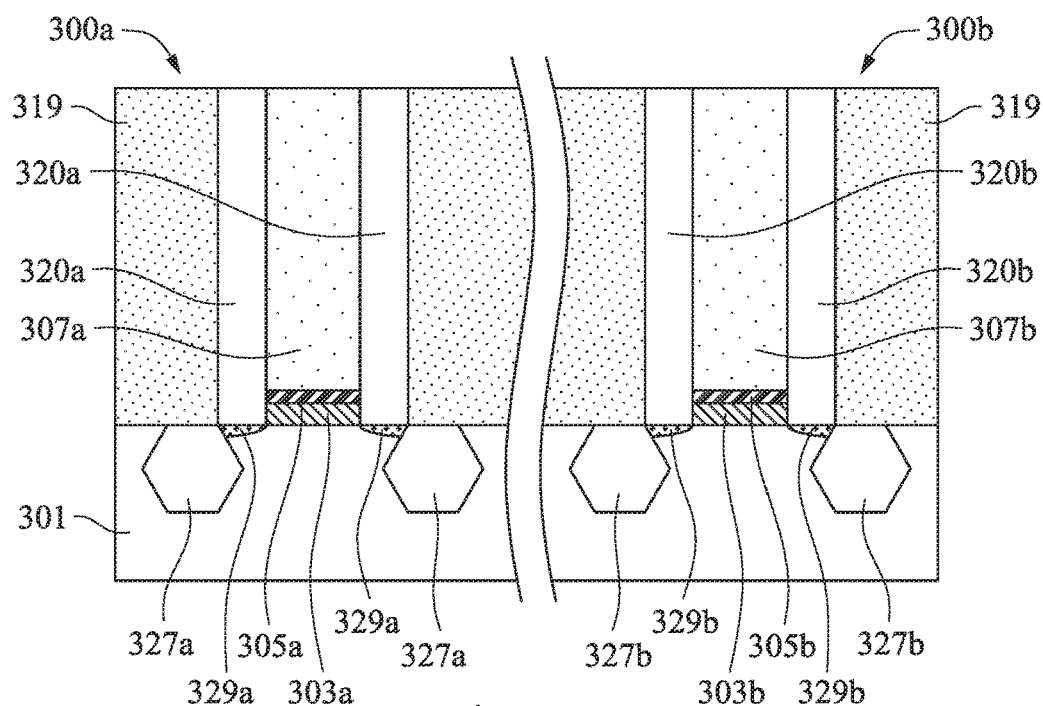

Reference is made to FIG. 7. After the ILD layer 319 is formed, an upper surface of the wafer 300 is planarized to lower the surface to the level of the dummy gate material layers 307a and 307b. The planarization is accomplished by, for example, chemical mechanical polishing (CMP). After planarizing, the patterned hard mask layers 309a and 309b are removed, and the dummy gate material layers 307a and 307b, the spacers 320a and 320b, and the ILD layer 319 all approximately have the same height.

Figure 8:
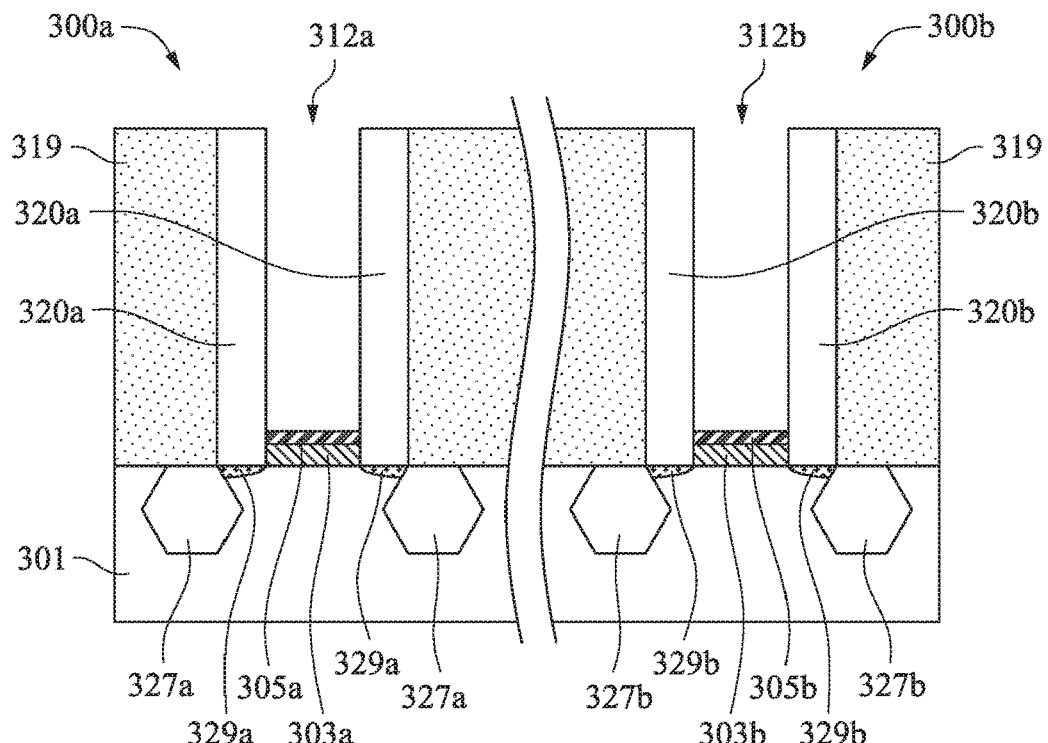

Reference is made to FIG. 8. The dummy gate material layers 307a and 307b are removed to form recesses 312a and 312b (operation 113 of FIG. 1). The dummy gate material layers 307a and 307b are removed in one or many etch operations including wet etch and dry etch. According to various embodiments, a hard mask is patterned over the wafer 300 to protect the ILD layer 319 and the spacers 320a and 320b. In some embodiments, a first etch process breaks through native oxide layers on the dummy gate material layers 307a and 307b, and a second etch process reduces the thickness of the dummy gate material layers 307a and 307b. The dummy gate material layer etch may stop at the high-k dielectric layers 305a and 305b or continues to the interfacial layers 303a and 303b or the semiconductor substrate 301 below. In other embodiments, only the dummy gate material layers 307a and 307b are removed. However, the etch processes may remove some surrounding material such as a portion of the spacers 320a and 320b. A recess 312a is formed between the spacers 320a, and a recess 312b is formed between the spacers 320b. As previously discussed, the high-k dielectric layers 305a, 305b may also be removed. If it is, then a high-k dielectric layer is formed in the recesses in a separate operation.

Figure 9:
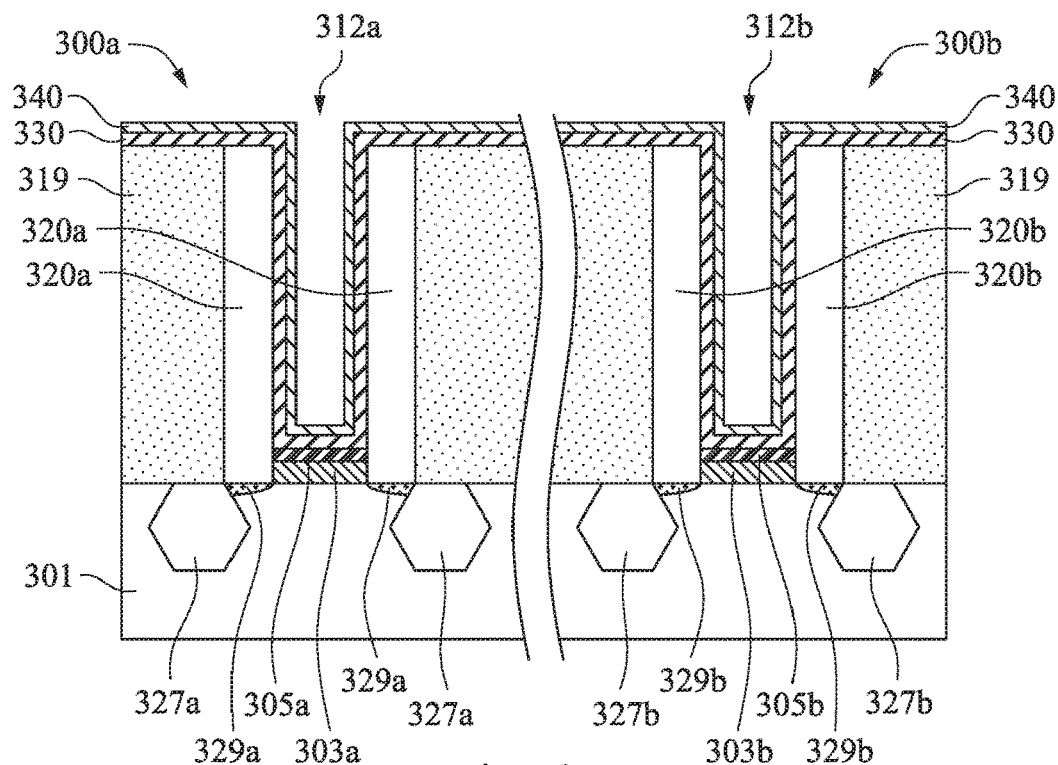

Attention is now invited to FIG. 9. A plurality of work function metal layers is deposited in the recesses 312a and 312b (operation 115 of FIG. 1). Two gate structures are denoted as 300a and 300b respectively for ease of reference. A first work function metal layer 330 is formed in the recesses 312a and 312b and follows the contour created by bottom surfaces and sidewalls of the recesses 312a and 312b and top surfaces of the spacers 320a and 320b and the ILD layer 319. A second work function metal layer 340 is deposited on the first work function metal layer 330 and conforms to the first work function metal layer 330. The first work function metal layer 330 is in direct contact with the high-k dielectric layers 305a and 305b. The second work function metal layer 340 inherits the configuration of the first work function metal layer 330.

The first and second work function metal layers 330 and 340 may include Ti, TiAl, TiAlN, TaC, TaCN, TaSiN, Mn, Zr, TiN, TaN, Ru, Mo, WN, Co, Al, or any suitable materials. For example, the first and second work function metal layers 330 and 340 include at least one of TiN, Co, WN, or TaC when at least one of the gate structures 300a and 300b is a portion of a PMOS device. Alternatively, the first and second work function metal layers 330 and 340 include at least one of Ti, Al, or TiAl when at least one of the gate structures 330a and 300b is a portion of an NMOS device. The first and second work function metal layers 330 and 330 may be deposited by, for example, CVD, plasma-enhanced CVD (PECVD), sputtering, ion beam, spin on, physical vapor deposition (PVD), ALD or the like.

Figure 10:
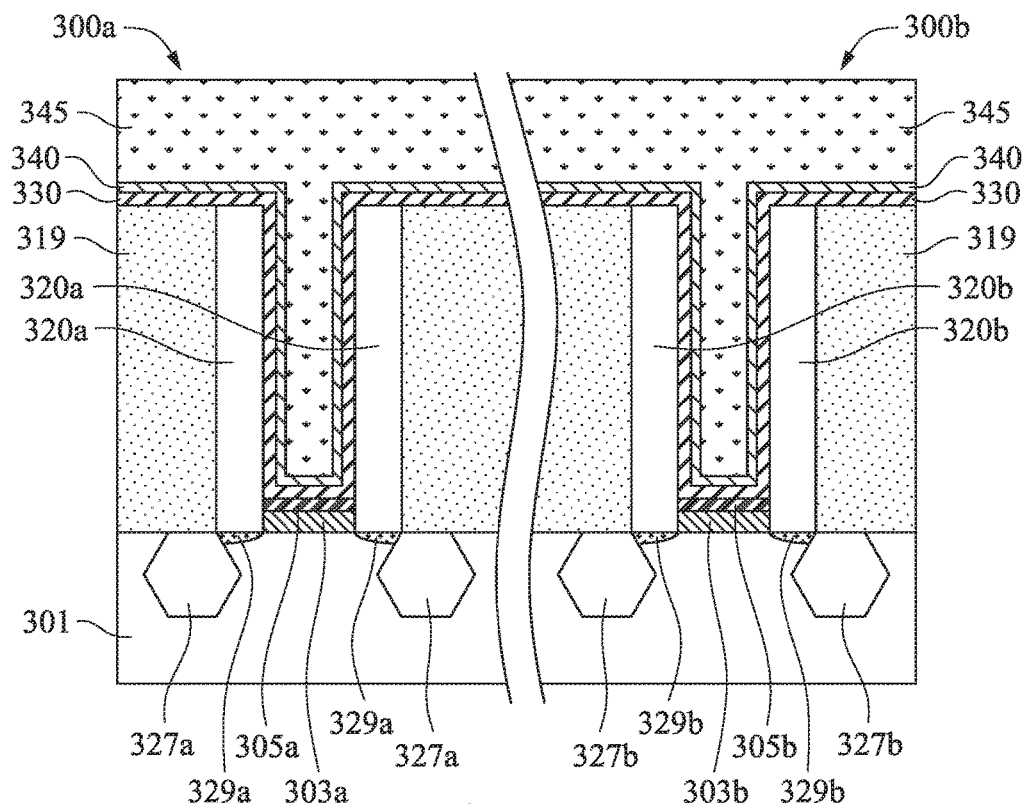

Attention is now invited to FIGS. 10-13. The second work function metal layer 340 is pulled back in two stages (operation 117 of FIG. 1). As shown in FIG. 10, a mask layer 345 is deposited on the substrate 301. In some embodiments, the mask layer 345 is, for example, a bottom anti-reflective coating (BARC) layer. The mask layer 345 fills in the recesses 312a and 312b and covers up the entire second work function meta layer 340 on the top surfaces of the spacers 320a and 320b and the ILD layer 319.

Figure 11:
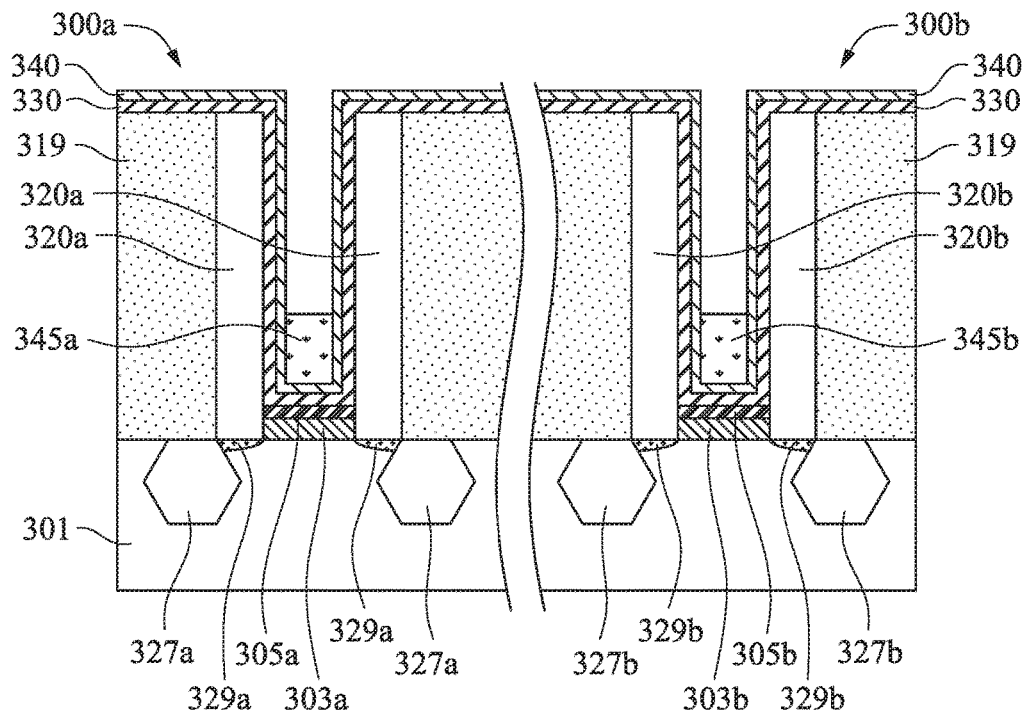

Next, please refer to FIG. 11. A first etching, for example, dry etching, is performed to pattern the mask layer 345. The patterned mask layers 345a and 345b retreats into the recesses 312a and 312b respectively. A surface level of the mask layers 345a and 345b is within the recesses 312a and 312b.

Figure 12:
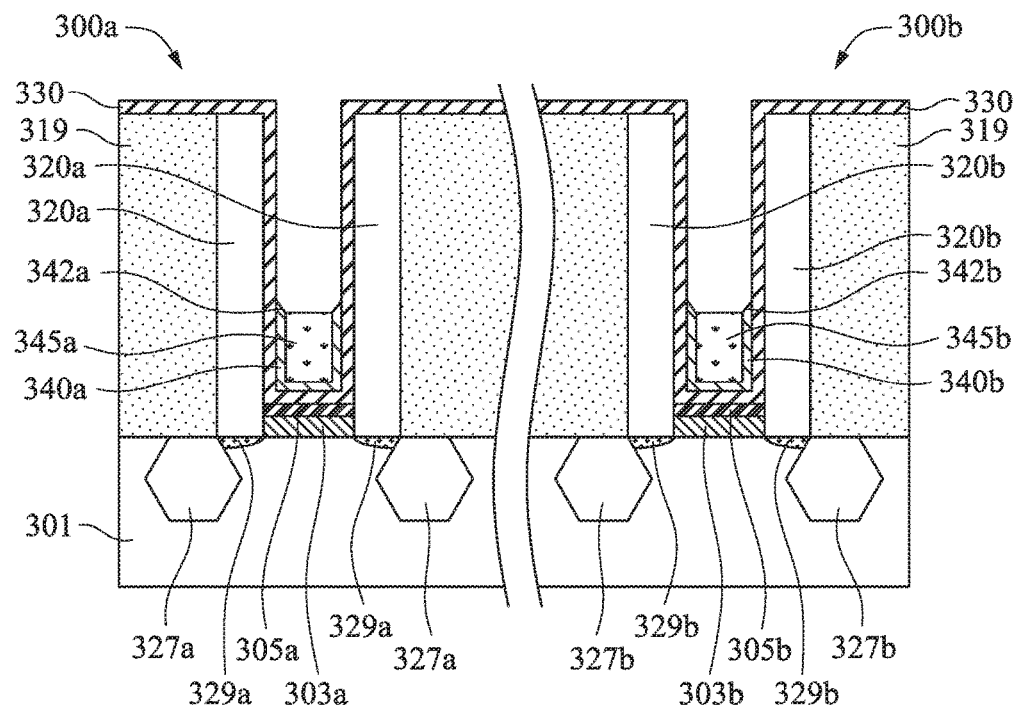

Attention is now invited to FIG. 12. After the first etching, in which the mask layer 345 is patterned to form the mask layers 345a and 345b, a second etching is performed. The second etching, for example, wet etching, targets at the second work function metal layer 340. During the second etching, the patterned mask layers 345a and 345b protect the underlying second work function metal layer 340 in the recesses 312a and 312b. After the second etching, the second work function metal layers 340a and 340b are lowered respectively into the recesses 312a and 312b, and top edges of the second work function metal layers 340a and 340b are modified along the course of the second etching to form slanting edges 342a and 342b. In some embodiments, the first work function metal layer 330 and the second work function metal layer 340 are made of different materials. The first work function metal layer 330 is made of a material that has an etch selectivity against the second work function metal layer 340 during the second etching.

Figure 13:
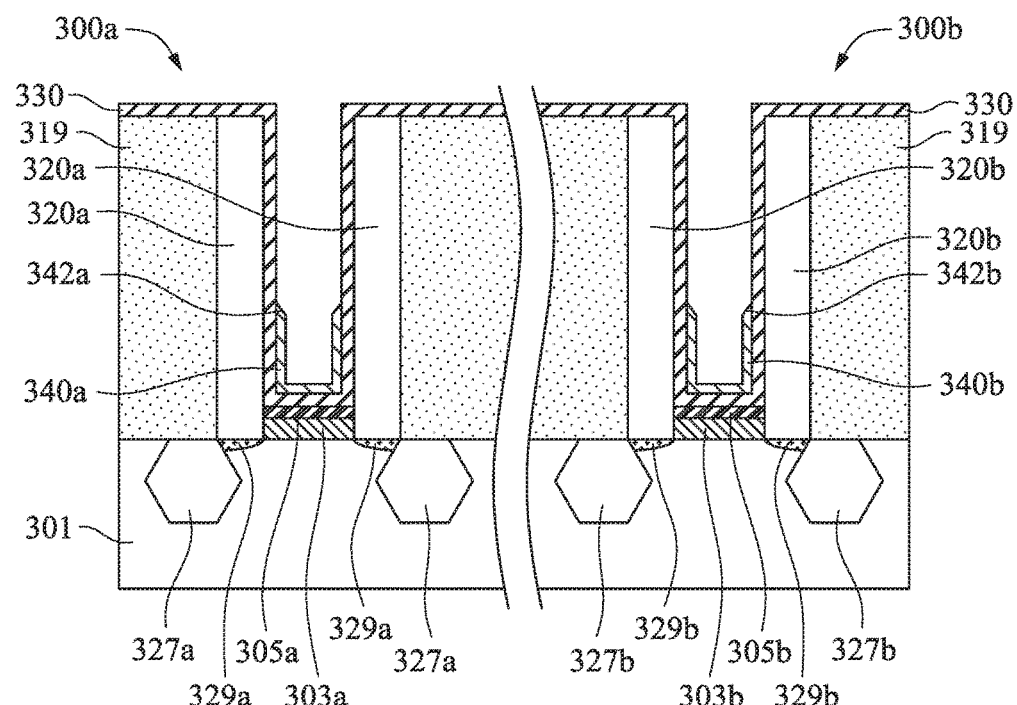

Attention is now invited to FIG. 13. The pull-back process targets at the second work function metal layer 340, while the first work function metal layer 330 retains its integrity at this stage because of etch selectivity. The patterned mask layers 345a and 345b are then removed from the wafer 300. The slanting edges 342a and 342b have a slope descending inwardly toward the respective recesses 312a and 312b (away from the spacers 320a and 320b). The slope of the tapered, slanting edges 342a and 342b ranges from about 15 to about 45 degrees. In some embodiments, the slanting edges 342a and 342b are rounded corners.

Figure 14:
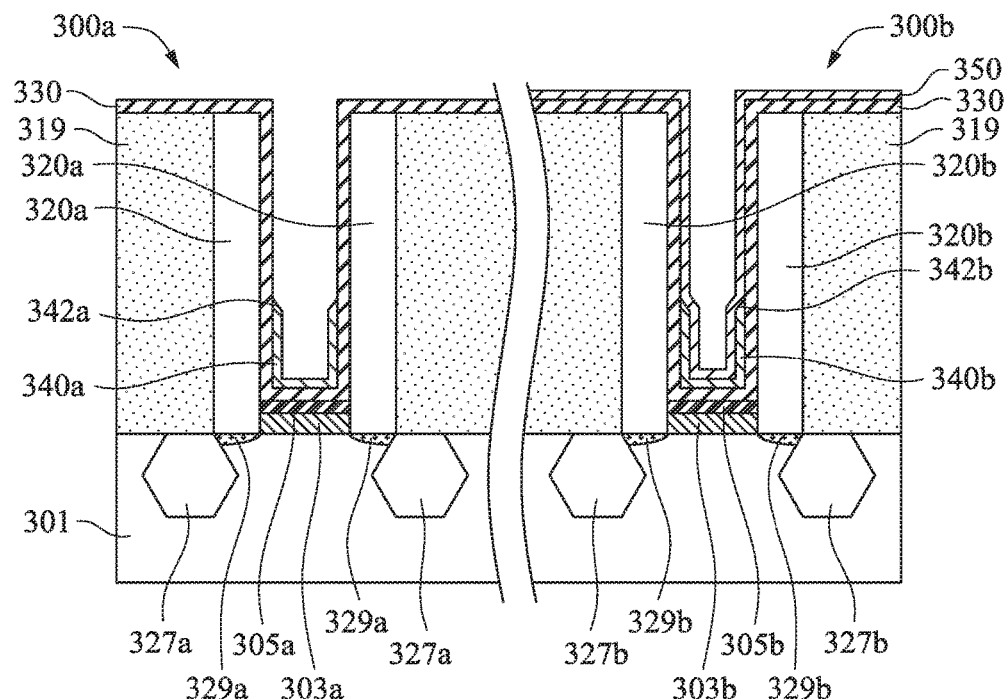

Turning now to FIG. 14. A third work function metal layer 350 is deposited on the wafer 300, and then a portion of the third work function metal layer 350 in the gate structure 300a is removed. In some embodiments, the gate structure 300a and the gate structure 300b are used to form transistors with different threshold voltages or transistors of different types, and, therefore, the gate structure 300a and the gate structure 300b have different numbers of work function metal layers. In some embodiments, the gate structure 300a does not include the third work function metal layer 350, while the gate structure 300b includes the third work function metal layer 350. In some embodiments, the gate structure 300a is a p-type gate electrode, and the gate structure 300b is an n-type gate electrode. A designed threshold voltage for n-type and p-type devices can be tuned through different combination of work function metal layers. Different patterns arise between the gate structures 300a and 300b because of different numbers or combination of work function metal layers so as to achieve desired threshold voltage. The third work function metal layer 350 conforms to the padded recess 312b, where the first work function metal layer 330 and the second work function metal layer 340b line the bottom surface and the sidewalls of the recess 312b. The third work function metal layer 350 overtakes the slanting edges 342b of the second work function metal layer 340b in the recess 312b, and therefore both the second and third work function metal layers 340b and 350 are in contact with the first work function metal layer 330. In addition, because the second work function metal layer 340b is modified at the edges, the third work function metal layer 350 follows the inverted, stepped, pyramid topology in the recess 312b.

Figure 15:
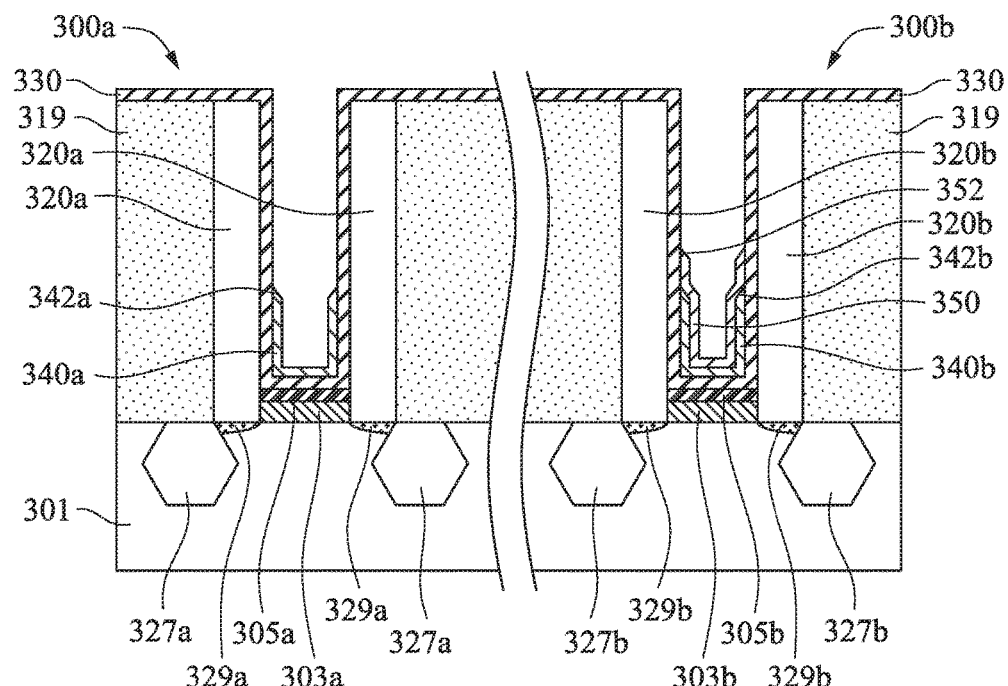

Turning now to FIG. 15, the third work function metal layer 350 is pulled back to yield slanting edges 352. Similar to the second work function metal layers 340a and 340b, the third work function metal layer 350 undergoes a series of etching. A mask layer is deposited, and the first etching defines a patterned mask layer over the third work function metal layer 350 in the recess 312b. Subsequently, the second etching results in the receding of the third work function metal layer 350 within the recess 312b and formation of slanting edges 352. The third work function metal layer 350 covers up the underlying second work function metal layer 340b. After the second etching, the third work function metal layer 350 contributes another level to the slanting sidewalls of the recess 312b. The slanting edges 342b are translated into the third work function metal layer 350. Likewise, the pull-back process targets at specific work function metal layer because of etch selectivity, and the first work function metal layer 330 retains its integrity throughout the second and third work function metal layer pullback.

Figure 16:
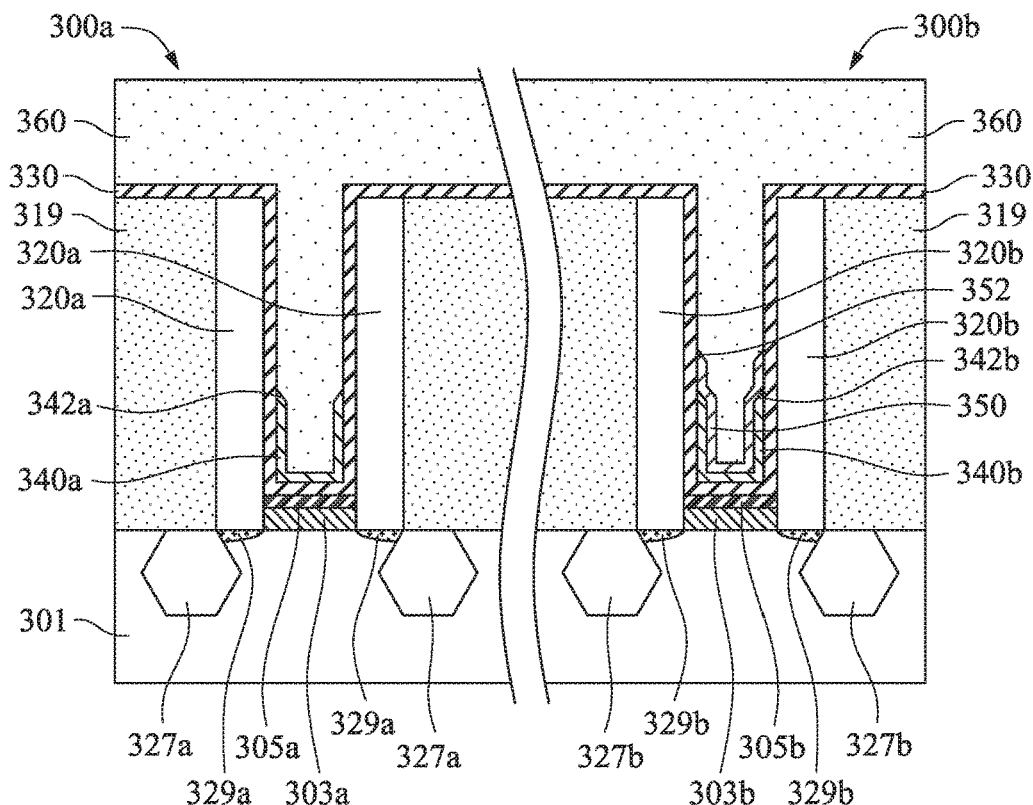

Turning now to FIG. 16, a filling metal 360 is deposited over the wafer 300 (operation 119 of FIG. 1). The filling metal 360 fills in the remaining portion of the recesses 312a and 312b and overfills the recesses 312a and 312b to cover up the first work function meta layer 330 on the top surfaces of the spacers 320a and 320b and the ILD layer 319. A material of the filling metal 360 may include, for example, tungsten (W). The gate structures 300a and 300b have different patterns results from different numbers of work function metal layers. As shown in FIG. 16, after the deposition of filling metal 360, the different contour of the recesses 312a and 312b is more pronounced. In the gate structure 300a, a portion of the filling metal 360 is enclosed by the second work function metal layer 340a, while the remaining portion of the filling metal 360 is in contact with the first work function metal layer 330. In the gate structure 300b, the filling metal 360 overfills the recess 312b and blankets the first work function metal layer 330 and the third work function metal layer 350. The filling metal 360 in the recess 312b is not in direct contact with the second work function metal layer 340b because the second work function metal layer 340b underlies the third work function metal layer 350 and is unexposed. The second work function metal layer 340b still contributes to the topology of the stepped recess 312b and serves its intended function, voltage manipulation. The tripled work function metal layers 330, 340b, and 350 collectively create tapered sidewalls in the recess 312b with an additional level in comparison with the doubled work function metal layers 330 and 340a in the recess 312a.

Figure 17:
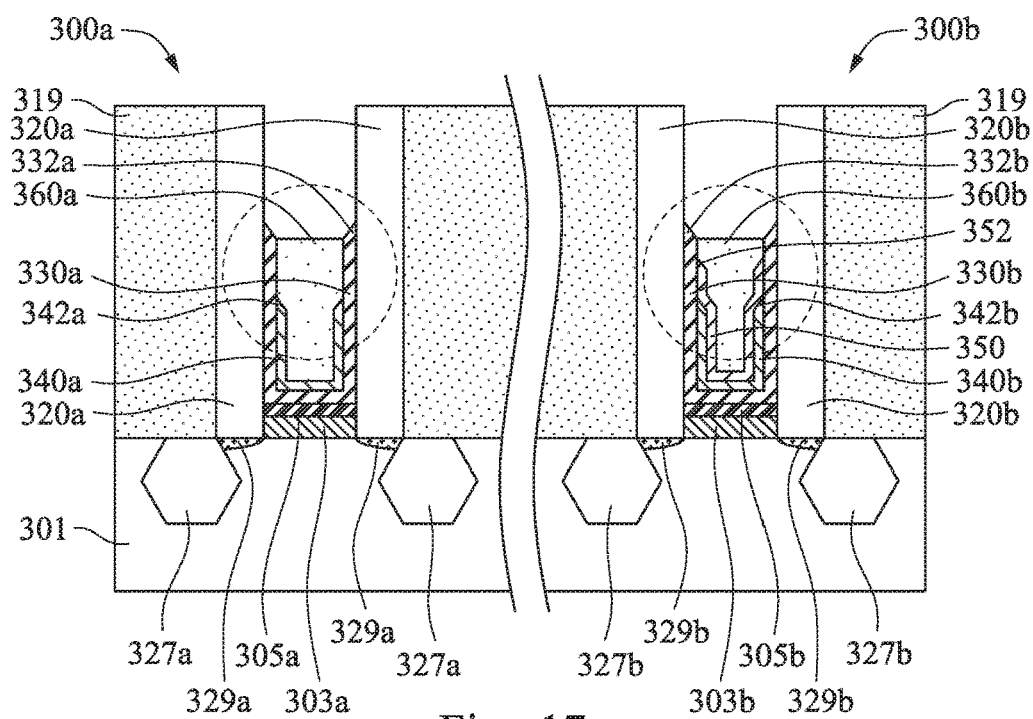

Attention is now invited to FIG. 17. An etching back is performed to bring down the filling metal 360 and the first work function metal layer 330 within the recesses 312a and 312b (operation 121 of FIG. 1). A universal etching back does not take different patterns in gate structures into consideration. When only filling metal 360 and the first work function metal layers 330 are the targets in the etching back process, variation between the gate structures is minimized.

Still referring to FIG. 17, the filling metal 360a is lowered to a level within the recesses 312a and 312b respectively, and the first work function metal layer 330 over the interlevel dielectric layer 319 is removed. The etching back continues until the first work function metal layers 330a and 330b retreat into the recess 312a and 312b. Slanting edges 332a and 332b of the first work function metal layers 330a and 330b respectively are formed during the etching back. The filling metals 360a and 360b reach to the brim of the first work function metal layers 330a and 330b in the recesses 312a and 312b. As a result, the filling metals 360a and 360b have surface areas that are both defined by the first work function metal layers 330a and 330b. In the universal etching back, only the first work function metal layers 330 and the filling metal 360 are removed. Because the second and the third work function metal layers 340a, 340b, and 350 are buried underneath in the recesses 312a and 312b respectively. When performing the etching back, the loading pattern arising from different numbers of work function metal layers can be omitted.

Figure 20:
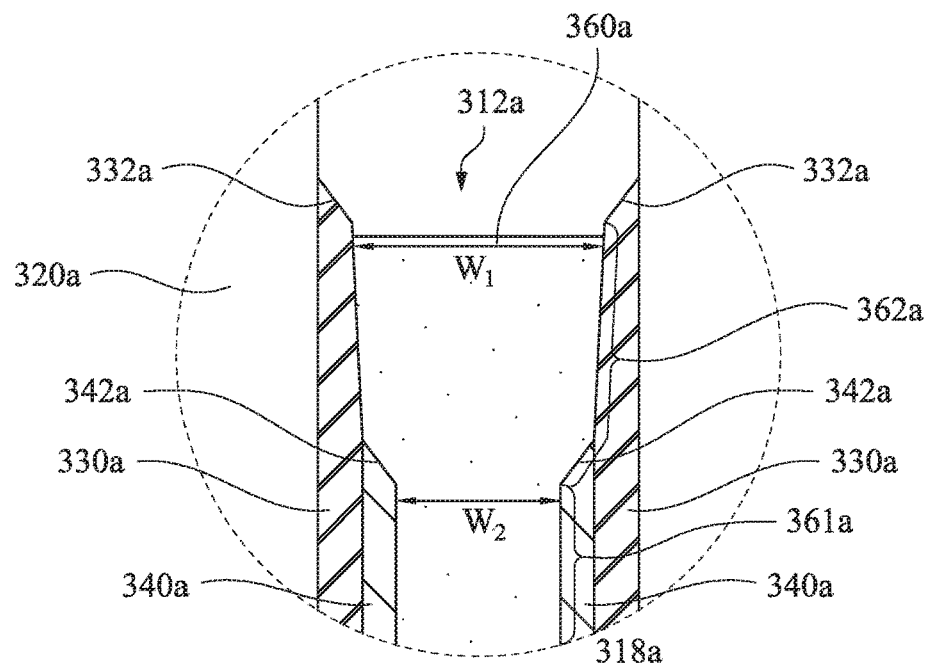
FIGS. 20 and 21 are zoom in view of dashed-line circles in FIG. 17 respectively.
Figure 21:
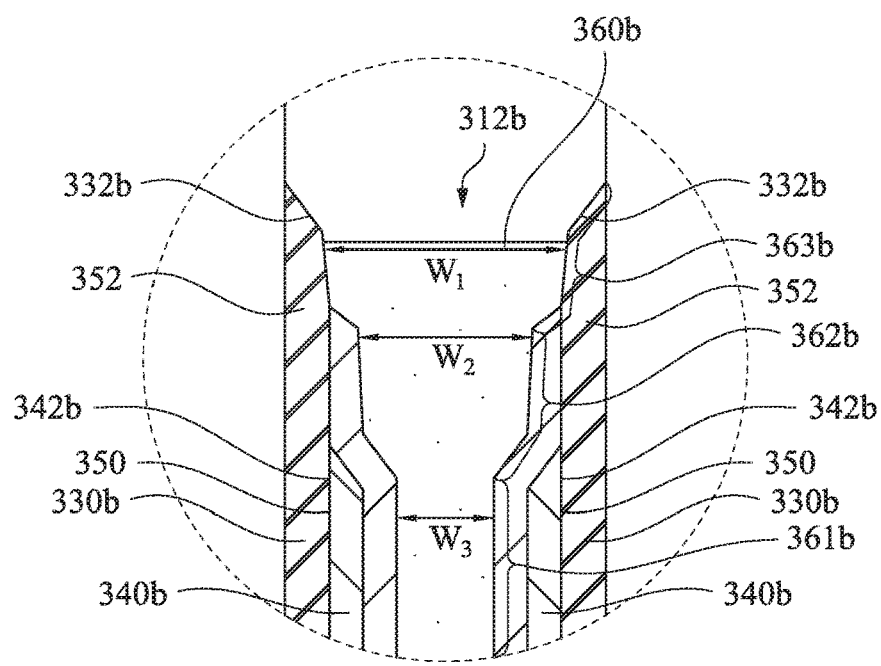

Turning now to FIGS. 20 and 21, illustrated zoom in view of the gate structures 300a and 300b. When the universal etching back is performed to lower the surface level of the filling metal 360, the filling metals 360a and 360b are brought to the same level within their respective recesses 312a and 312b. Portions of the first work function metal layers 330 are removed in the etching back, while the second and third work function metal layers 340a and 350 retain their configuration and are unexposed. A lower portion of the filling metals 360a and 360b are in contact with the second work function metal layer 340a or the third work function metal layer 350. The work function metal layers 330a, 330b, 340a, 340b, and 350 serve their intended function, while the work function metal layers 340a, 340b, and 350 is sealed behind the filling metals 360a and 360b. Since the second and third work function metal layers 340a, 340b, and 350 are buried under the filling metals 360a and 360b, even if the loading patterns (i.e., numbers of work function metal layers) in the gate structures 300a and 300b are different, the topology from a top view is similar.

As shown in FIG. 20, the first and second work function metal layers 330a and 340a create tapered sidewalls in the recesses 312a. The filling metal 360a fills in the recess 312a and resembles a two-level inverted pyramid. The first work function metal layer 330a defines a first width $W_1$ that is measured from one slanting edge 332 to the other slanting edge 332. The second work function metal layer 340a defines a second width $W_2$ that is measured from one slanting edges 342a to the other slanting edge 342a. The filling metal 360a fills in the tapered recess 312a, and a first portion 361a of the filling metal 360a is between the semiconductor substrate 301 and a second portion 362a of the filling metal 360a. The first portion 361a of the filling metal 360a has the second width $W_2$, and a second portion 362a of the filling metal 360a has the first width $W_1$. The filling metal 360a fans out from the bottom surface of the recess 312a because the second work function metal layer 340a is buried underneath. The broader first width $W_1$ is retained for the filling metal 360a, and the second work function metal layer 340a along with its narrower second width $W_2$ is unexposed.

Likewise, as shown in FIG. 21, in addition to the first and second width $W_1$ and $W_2$ which are defined by the first and second work function metal layers 330b and 340b respectively, the third work function metal layer 350 defines a third width $W_3$ that is measured from one slanting edges 352 to the other slanting edge 352. The third width $W_3$ is the narrowest among the three widths because the third work function metal layer 350 is further compressed within the space left out by the second work function metal layer 340b. The filling metal 360b fills in the tapered recess 312b, and from the bottom to the top are the first portion 361b, the second portion 362b and a third portion 363b. The third portion 363b of the filling metal 360b has the broadest first width $W_1$. The filling metal 360a fans out from the bottom surface of the recess 312b because the second and the third work function metal layers 340b and 350 are buried under the filling metal 360b. The broader third portion 363b of the filling metal, which has the first width $W_1$, is retained, and the narrower first and second portions 361b and 362b of the filling metal 360b are buried underneath.

In practical, on top of the width of each of the work function metal layers, the work function metal layers have varied slopes along the sidewalls of the recess. In the recess 312a shown in FIG. 20, the first work function metal layer 330a has a milder slope in comparison with the second work function metal layer 340a. The second work function metal layer 340a has a nearly vertical slope at the bottom of the recess 312a. The first portion 361a of the filling metal 360a, which fills in the bottom portion of the recess 312a, has a steeper slope than the second portion 362a thereof. As shown in FIG. 21, the third work function metal layer 350 adds another level to the tapered sidewalls of the recess 312b, and the slopes from the top to the bottom surface of the recess 312b increases gradually. The first portion 361b of the filling metal 360b has a nearly vertical slope at the bottom of the recess 312b, and when it comes to the second portion 362b of the filling metal 360b, the slope becomes milder. The third portion 363b of the filling metal 360b, which is at the top portion of the recess 312b, has the least steep slope in the recess 312b.

Still referring to FIGS. 20 and 21, regardless the element arrangement within the recesses 312a and 312b, a top view of the gate structures 300a and 300b is similar with only the filling metals 360a and 360b and the first work function metal layer 330a and 330b to be found. More than similar exposed elements in different gate structures, the configuration form the top view is uniform as well. The filling metals 360a and 360b have the same width which is defined by the lip portion of the first work function metal layers 330a and 330b respectively. The uniform topology of the gate structures 300a and 300b from the top view have advantageous effects to the subsequent process.

Figure 18:
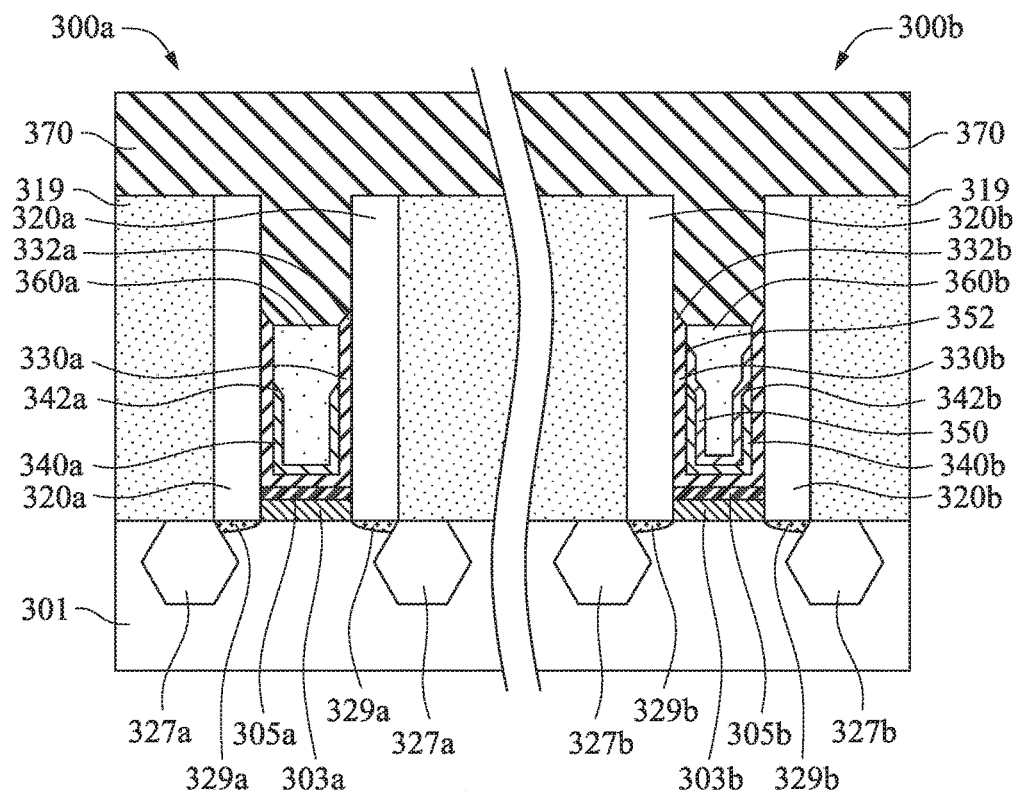

Turning now to FIG. 18, a protection layer 370, for example, a nitride layer, fills in the remaining of the recesses 312a and 312b. The protection layer 370 serves to protect the underlying components like the work function metal layers. In either the recess 312a or the recess 312b, the protection layer 370 is held at the same level. In addition, the underlying element arrangement is uniform. The protection layer 370 is in contact with the slanting edges 332a and 332b of the first work function metal layer 330a and 330b and the filling metals 360a and 360b. The slanting edges 332a and 332b of the first work function metal layer 330a and 330b are at the same height, and the filling metals 360a and 360b have the same surface area and dimension from a top view.

Figure 19:
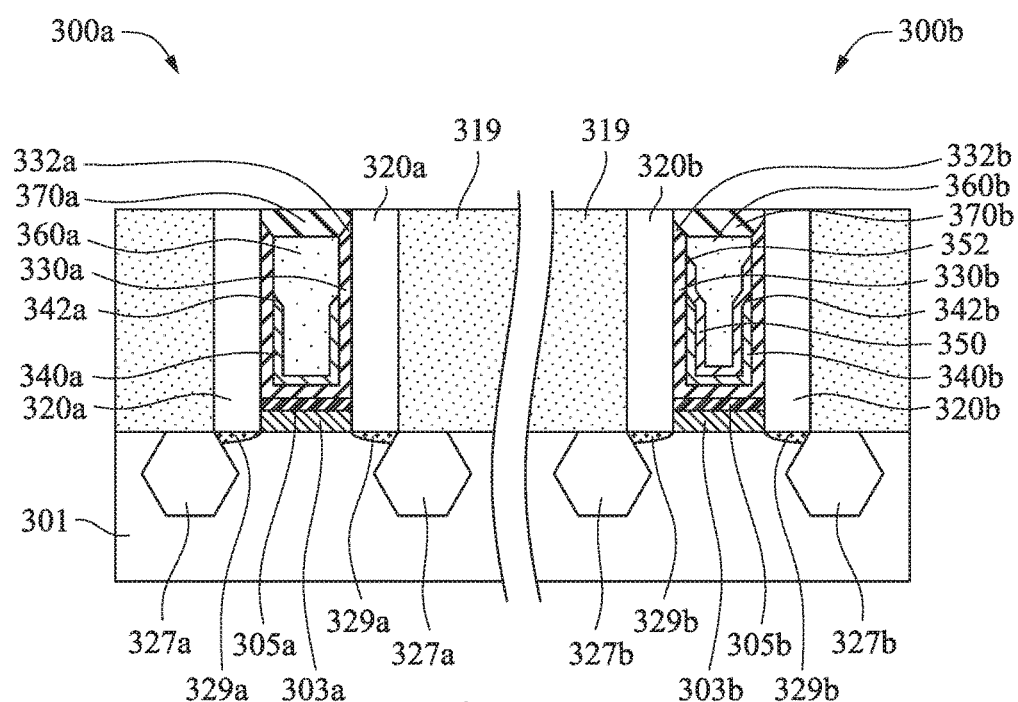

Turning now to FIG. 19, a polishing process, for example, CMP is performed, and the gate structures 300a and 300b are lowered to a level near to the slanting edges 332a and 332b of the first work function metal layers 330a and 330b. Due to the same topology within the recesses 312a and 312b, the position of the slanting edges 332a and 332b are taken into consideration. That is, regardless the number of work function metal layers, the protection layer 370 polishing is universally applied to the gate structures 300a and 300b with the same parameters because the interface topology between the protection layer 370 and in each of the gate structures 300a and 300b are similar, and the interface are located at the same level. In this case, edges of the work function metal layers are less likely to go through the protection layers 370a and 370b in the polishing process.

The protection layers 370a and 370b prevent aggressive invasion, for example, chemical agent like acid in the following etching process. In the case when defects are formed in the protection layer, foreign material can cause metal gate missing or compromising the function of other components. By having the same topology even with different loading patterns, when polishing the protection layer, attention is paid to the first work function metal layer and the filling metal without worrying the underlying work function metal layers in different gate structures.

Figure 22:
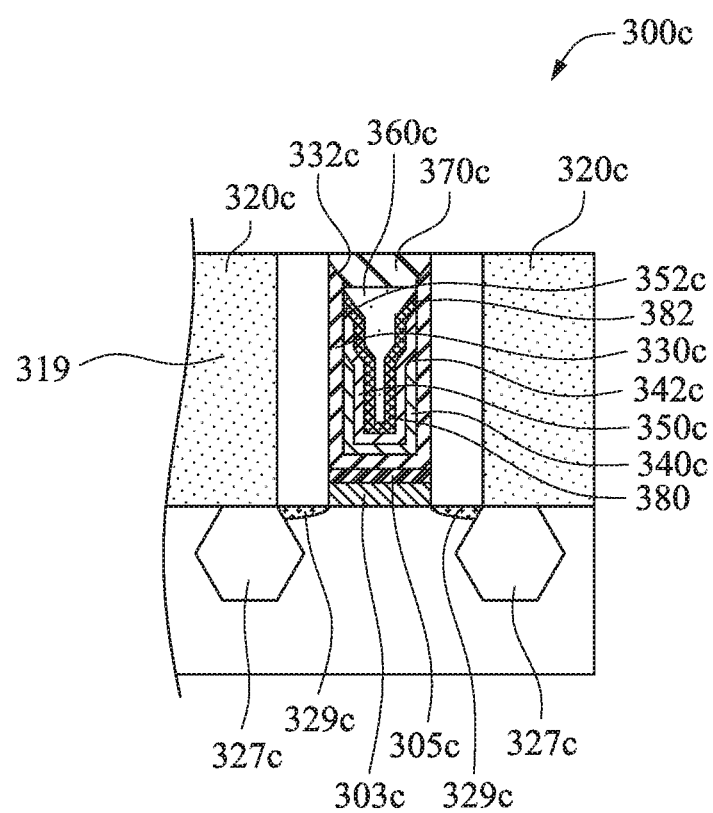
FIG. 22 illustrates the cross-sectional view of an intermediate stage in the formation of a high-k metal gate stack in accordance with some embodiments of the instant disclosure.

Turning now to FIG. 22, a gate structure 300c is shown with four-layer of work function metal layers. The gate structure 300c includes the first, second, third work function metal layers 330c, 340c, and 350c. In addition, the gate structure 300c includes a fourth work function metal layer 380 formed over the third work function metal layer 350c. Compared to the gate structure 300b, the gate structure 300c goes through one more work function metal layer pull-back in the process. The fourth work function metal layer 380 blankets the third work function metal layer 350c within the recess 312c, and the slanting edges 342c and 352c are translated into the fourth work function metal layer 380. The sidewalls of the recess 312c show a four-level inverted pyramid with gradually reduced slope from the bottom to the top. The filling metal 360c still has the same surface area and topology with the filling metals 360a and 360b even if the number of work function metal layers increases to four.

Apart from the first work function metal layers, the remaining work function metal layers are buried under the filling metal. Etching back of the first work function metal layer and the filling metal will be much easier because other than the first work function metal layer the remaining work function metal layers are not etched during the etching back. The resulting configuration gives similar topology from a top view among different gate structures.

In some embodiments of the instant disclosure, a gate structure includes at least one spacer defining a gate region over a semiconductor substrate, a gate dielectric layer disposed on the gate region over the semiconductor substrate, a first work function metal layer disposed over the gate dielectric layer and lining a bottom surface of an inner sidewall of the spacer, and a filling metal partially wrapped by the first work function metal layer. The filling metal includes a first portion and a second portion, wherein the first portion is between the second portion and the substrate, and the second portion is wider than the first portion.

In some embodiments of the instant disclosure, a gate structure includes at least one spacer defining a gate region over a substrate, a gate dielectric layer disposed on the gate region over the substrate, a first work function metal layer disposed over the gate dielectric layer and lining portions of an inner sidewall of the spacer. The first work function metal layer has at least on slanting edge. The gate structure also includes a filling metal partially wrapped by the first work function metal layer. The slanting edge of the first work function metal layer is buried under the filling metal.

In some embodiments of the instant disclosure, a method includes forming at least one dummy gate stack including a gate dielectric layer and a dummy gate material layer overlying the gate dielectric layer. An inter-layer dielectric (ILD) layer is formed around the dummy gate stack. At least the dummy gate material layer is removed from the dummy gate stack to form at least one recess. At least one work function metal layer is formed on a bottom surface and at least one sidewall of the recess. A first portion of the work function metal layer is removed from the sidewall of the recess. A second portion of the work function metal layer remains on the sidewall of the recess after the removing. Then, a remaining portion of the recess is filled with a filling metal.

The foregoing outlines features of several embodiments so that those skilled in the art may better understand the aspects of the instant disclosure. Those skilled in the art should appreciate that they may readily use the instant disclosure as a basis for designing or modifying other processes and structures for carrying out the same purposes and/or achieving the same advantages of the embodiments introduced herein. Those skilled in the art should also realize that such equivalent constructions do not depart from the spirit and scope of the instant disclosure, and that they may make various changes, substitutions, and alterations herein without departing from the spirit and scope of the instant disclosure.

What is claimed is:

1. A gate structure, comprising:
    a pair of spacers defining a gate region over a semiconductor substrate;
    a gate dielectric layer disposed on the gate region over the semiconductor substrate;
    a first work function metal layer disposed over the gate dielectric layer and disposed between a first spacer of the pair of spacers and a second spacer of the pair of spacers, wherein the first work function metal layer has a top surface and a sidewall;
    a second work function metal layer disposed over the first work function metal layer, wherein:
        the second work function metal layer has a top surface, and
        the sidewall of the first work function metal layer extends between the top surface of the first work function metal layer and the top surface of the second work function metal layer; and
    a filling metal having a tapered sidewall in contact with the sidewall of the first work function metal layer.

2. The gate structure of claim 1, comprising:
    a protection layer over the filling metal.

3. The gate structure of claim 2, wherein the protection layer extends between the first spacer and the second spacer.

4. The gate structure of claim 2, wherein the protection layer has a tapered sidewall in contact with the top surface of the first work function metal layer.

5. The gate structure of claim 1, comprising:
    a protection layer in contact with the top surface of the first work function metal layer.

6. The gate structure of claim 1, wherein the filling metal is in contact with the top surface of the second work function metal layer.

7. The gate structure of claim 1, wherein the top surface of the first work function metal layer is sloped.

8. The gate structure of claim 1, wherein the first work function metal layer is in contact with a sidewall of the first spacer.

9. The gate structure of claim 1, comprising:
    a third work function metal layer, wherein the third work function metal layer is spaced apart from the filling metal by the second work function metal layer.

10. The gate structure of claim 9, wherein the second work function metal layer overlies the third work function metal layer.

11. The gate structure of claim 9, wherein the third work function metal layer is disposed between the first work function metal layer and the second work function metal layer.

12. The gate structure of claim 11, wherein the second work function metal layer is in contact with the first work function metal layer.

13. A gate structure, comprising:
    a first work function metal layer disposed over a gate dielectric layer and lining a portion of a sidewall of a spacer;
    a second work function metal layer disposed over the first work function metal layer, wherein the second work function metal layer has a sloped top surface;
    a third work function metal layer disposed over the second work function metal layer; and
    a filling metal in contact with the first work function metal layer and the third work function metal layer, wherein the second work function metal layer is spaced apart from the filling metal by the third work function metal layer.

14. The gate structure of claim 13, wherein the third work function metal layer is in contact with the first work function metal layer.

15. The gate structure of claim 13, wherein the third work function metal layer overlies the second work function metal layer.

16. The gate structure of claim 13, wherein a first portion of a sidewall of the first work function metal layer is in contact with the second work function metal layer and a second portion of the sidewall of the first work function metal layer is in contact with the third work function metal layer.

17. A method of forming a gate structure, the method comprising:
    forming a first work function metal layer on a sidewall of a material that defines a recess;
    forming a second work function metal layer over the first work function metal layer;
    removing a first portion of the second work function metal layer to expose a first portion of a sidewall of the first work function metal layer, wherein a second portion of the second work function metal layer remains on a second portion of the sidewall of the first work function metal layer after the removing;
    filling the recess with a filling metal;
    removing a portion of the filling metal to expose the first work function metal layer and form a second recess; and
    depositing a protection layer in the second recess to contact the first work function metal layer, wherein the protection layer is spaced apart from the second portion of the second work function metal layer by the filling metal.

18. The method of claim 17, comprising:
    forming a mask layer in the recess to mask the second portion of the second work function metal layer, wherein removing the first portion of the second work function metal layer comprises:
removing the first portion of the second work function metal layer while the mask layer is masking the second portion of the second work function metal layer.

19. The method of claim 17, comprising:
forming a third work function metal layer over the second portion of the second work function metal layer and over the first work function metal layer prior to filling the recess with the filling metal.

20. The method of claim 19, comprising:
removing a portion of the third work function metal layer to expose at least some of the first portion of the sidewall of the first work function metal layer.

* * * * *